(12) United States Patent
Wakisaka

(10) Patent No.: US 8,319,346 B2
(45) Date of Patent: Nov. 27, 2012

(54) SEMICONDUCTOR STRUCTURE AND MANUFACTURING METHOD OF SEMICONDUCTOR STRUCTURE

(75) Inventor: Shinji Wakisaka, Hanno (JP)

(73) Assignee: Teramikros, Inc., Ome-Shi (JP)

( * ) Notice: Subject to any disclaimer, the term of this patent is extended or adjusted under 35 U.S.C. 154(b) by 0 days.

(21) Appl. No.: 13/074,279

(22) Filed: Mar. 29, 2011

(65) Prior Publication Data

US 2011/0233787 A1 Sep. 29, 2011

(30) Foreign Application Priority Data

Mar. 29, 2010 (JP) ................................ 2010-075099

(51) Int. Cl.
*H01L 23/48* (2006.01)
(52) U.S. Cl. ............... 257/773; 257/698; 257/E23.068; 257/E21.575
(58) Field of Classification Search .................. 257/698, 257/750, 758, 774, 773, E23.011, E23.145, 257/E23.068, E21.575
See application file for complete search history.

(56) References Cited

U.S. PATENT DOCUMENTS

| 5,545,849 | A | * | 8/1996 | Kondo | ............................ | 174/559 |
| 7,618,886 | B2 | * | 11/2009 | Jobetto et al. | .................. | 438/613 |

| 2004/0104478 | A1 | | 6/2004 | Noguchi | | |
| 2006/0006511 | A1 | * | 1/2006 | Roh et al. | ........................ | 257/680 |
| 2007/0069232 | A1 | * | 3/2007 | Kameyama et al. | ............ | 257/99 |

FOREIGN PATENT DOCUMENTS

| JP | 2004-209585 A | 7/2004 |
| JP | 2005-109221 A | 4/2005 |
| JP | 2009-072848 A | 4/2009 |

OTHER PUBLICATIONS

U.S. Appl. No. 13/074,233; First Named Inventor: Shinji Wakisaka; Title: "Semiconductor Structure, Manufacturing Method of Semiconductor Structure and Semiconductor Device"; filed Mar. 29, 2011.
U.S. Office Action dated Jul. 7, 2012 issued in related U.S. Appl. No. 13/074,233.

* cited by examiner

*Primary Examiner* — Jasmine Clark
(74) *Attorney, Agent, or Firm* — Holtz, Holtz, Goodman & Chick, PC

(57) ABSTRACT

Disclosed is a semiconductor structure including a semiconductor substrate including an electronic circuit which is provided in a predetermined region of the semiconductor substrate; a wall which is formed to encircle the predetermined region of the semiconductor substrate; a wiring provided in a region of the semiconductor substrate outside of the predetermined region of the semiconductor substrate; an external connection electrode provided on the wiring; a sealing resin which seals the wiring, the sealing resin being filled in the region of the semiconductor substrate outside of the wall; and a transparent resin to seal the predetermined region of the semiconductor substrate, the transparent resin being filled inside of the wall.

8 Claims, 10 Drawing Sheets

SEMICONDUCTOR STRUCTURE AND MANUFACTURING METHOD OF SEMICONDUCTOR STRUCTURE

BACKGROUND OF THE INVENTION

1. Field of the Invention

The present invention relates to a semiconductor structure and a manufacturing method of the semiconductor structure.

2. Description of the Related Art

There is suggested a semiconductor structure in which a special electronic circuit having MEMS (Micro Electro Mechanical System) is formed in addition to a general electronic circuit (for example, see JP2005-109221). For example, MEMS is a mechanical device such as an acceleration sensor (for example, see JP2009-72848), a cantilever (for example, see JP2004-209585) and the like or an optical device.

SUMMARY OF THE INVENTION

In the semiconductor structure having an optical device, a place where light enters or exits is needed.

An object of the present invention is to improve the productivity of a semiconductor structure such as above.

A semiconductor structure of the present invention includes a semiconductor substrate including an electronic circuit which is provided in a predetermined region of the semiconductor substrate, a wall which is formed to encircle the predetermined region of the semiconductor substrate, a wiring provided in a region of the semiconductor substrate outside of the predetermined region of the semiconductor substrate, an external connection electrode provided on the wiring, a sealing resin which seals the wiring, the sealing resin being filled in the region of the semiconductor substrate outside of the wall and a transparent resin to seal the predetermined region of the semiconductor substrate, the transparent resin being filled inside of the wall.

Further, a manufacturing method of a semiconductor structure of the present invention includes forming an external connection electrode and a wall which encircles a predetermined region of a semiconductor substrate on a wiring layer arranged in a region of the semiconductor substrate outside of the predetermined region of the semiconductor substrate; placing a lid on the wall, the lid covers an upper space of the region of the semiconductor substrate outside of the predetermined region of the semiconductor substrate; filling a transparent resin inside of the wall, the transparent resin seals the predetermined region of the semiconductor substrate; removing the lid; filling a sealing resin in the region of the semiconductor substrate outside of the wall, the sealing resin seals a connection pad and a wiring; and trimming an upper surface of the sealing resin, an upper surface of the external connection electrode and an upper surface of the wall along with the transparent resin.

According to the present invention, the productivity of the above semiconductor structure can be improved.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENT

Figure 1:
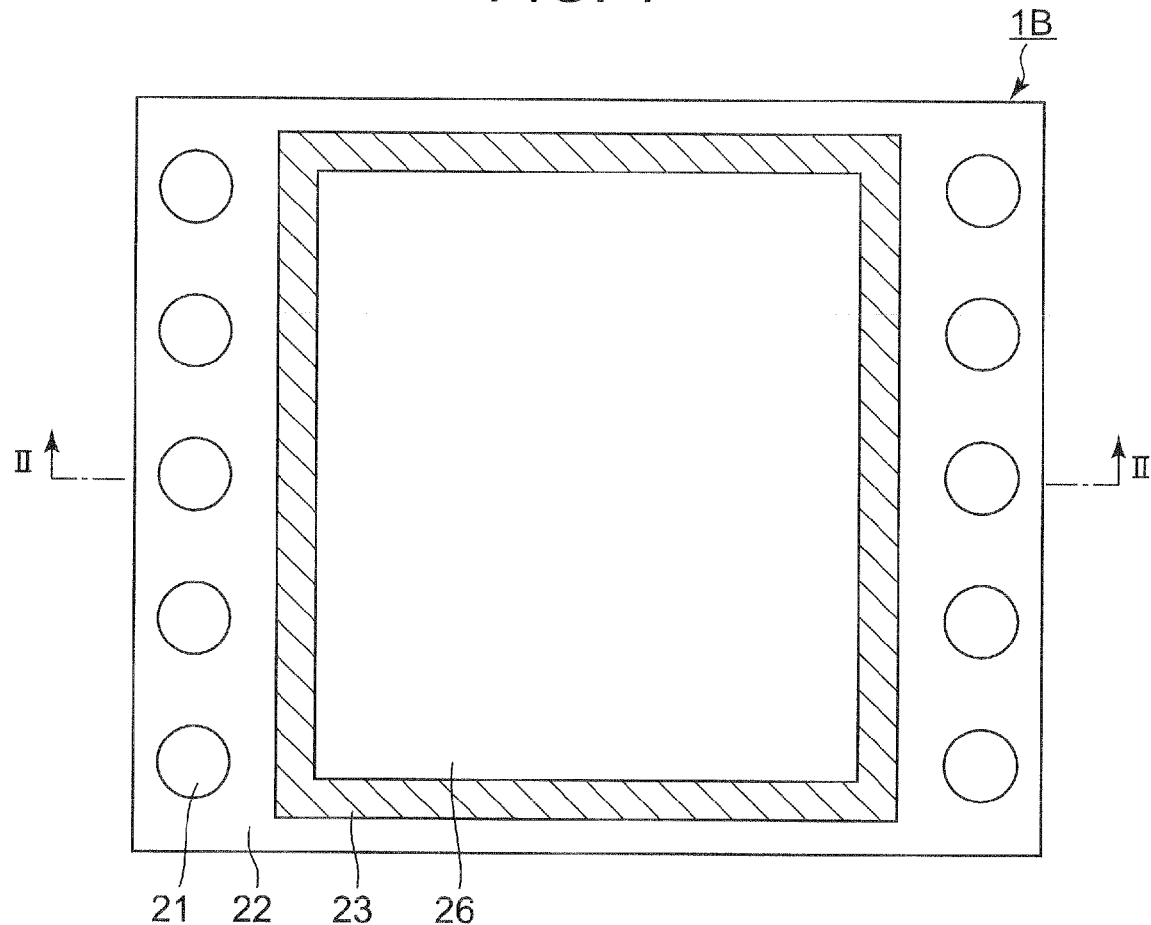
FIG. 1 is a plan view showing a semiconductor structure 1B according to the first embodiment of the present invention.
Figure 2:
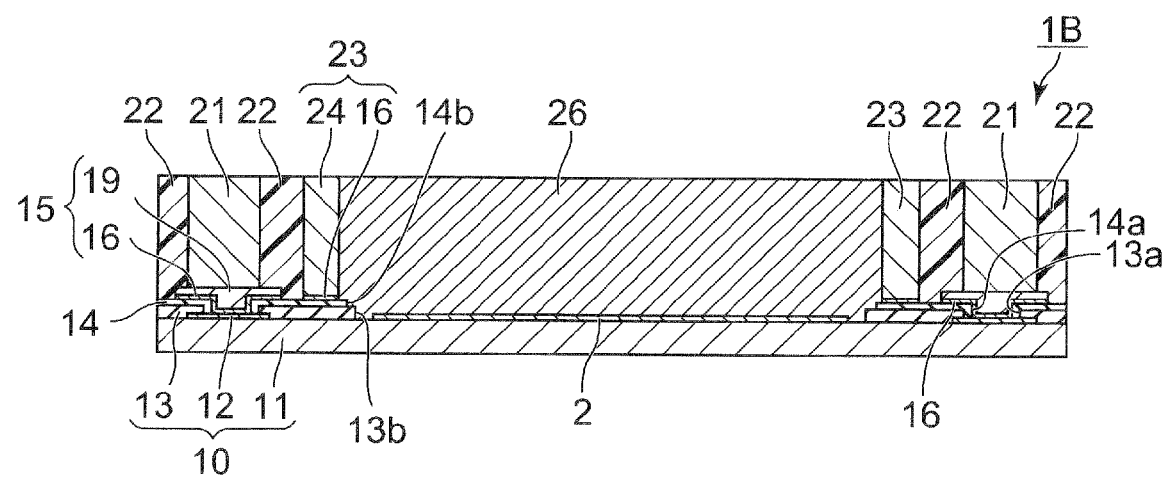
FIG. 2 is a cross-sectional view when cut along the line II-II in FIG. 1.

FIG. 1 is a plan view showing a semiconductor structure 1B according to the embodiment of the present invention and FIG. 2 is a cross-sectional view when cut along the line II-II in FIG. 1. As shown in FIGS. 1 and 2, in the semiconductor structure 1B, an insulating film 14, wirings 15, external connection electrodes 21, a sealing resin 22, a wall 23, a transparent resin 26 and the like are formed on the surface of the semiconductor device wafer 10.

As shown in FIG. 1, the semiconductor device wafer 10 includes a semiconductor substrate (including a semiconductor wafer) 11 formed of silicon or the like, a plurality of connection pads 12 formed of a conductive material such as metal and a protective insulating film 13 formed of an insulating material such as oxide silicon, nitride silicon or the like.

In an upper surface-side of a semiconductor substrate 11, an electronic circuit 2, connection pads 12 and wirings for connecting the electronic circuit 2 and the connection pads 12, and the like are formed. The electronic circuit 2 is an optical device which does not have a movable part and is a photosensor, an infrared imager or the like, for example.

The connection pads 12 are connected with a wiring (not shown in the drawing) on the semiconductor substrate 11. The protective insulating film 13 is formed on the surface of the semiconductor substrate 11 and covers the wirings and the like on the semiconductor substrate 11.

Further, a plurality of openings 13a for exposing the connection pads 12 and an opening 13b for exposing the electronic circuit 2 are provided in the protective insulating film 13. As shown in FIGS. 1 and 2, the openings 13a are smaller than the connection pads 12 and the opening 13b is larger than the electronic circuit 2.

The insulating film 14 which is formed of epoxy resin, polyimide resin or the like is formed on the upper surface of the protective insulating film 13. As for the insulating film 14, a highly functional plastic material such as polyimide, polybenzoxazole (PEG) or the like, a plastic material of epoxy system, phenolic system, silicon system or the like, or a composite material of the above mentioned materials can be used.

A plurality of openings 14a for exposing the connection pads 12 and an opening 14b for exposing the electronic circuit 2 are provided in the insulating film 14. When the insulating film 14 is formed of photosensitive resin, the openings 14a and 14b can be formed at once by applying the photosensitive resin on the semiconductor device wafer 10 and by exposing, developing and curing the photosensitive resin thereon. Further, for example, the openings 14a and 14b can be formed by irradiating a laser to the insulating film 14. As shown in FIGS. 1 and 2, the openings 14a of the insulating film 14 are smaller than the openings 13a of the protective insulating film 13, and the connection pads 12 and the insulating film 14 are in close contact with each other at peripheries of the openings 14a. Further, the opening 14b of the insulating film 14 is larger than the electronic circuit 2, and the electronic circuit 2 is exposed at the opening 14b of the insulating film 14.

Each of a plurality of wirings 15 is formed on each of the connection pads 12. Each of center portions of the connection pads 12 is exposed and each of peripheral portions of the connection pads 12 is covered with the insulating film 14. Each of the wirings 15 includes an electroplating seed layer 16 which is a lower layer including copper or the like which becomes a core for electroplating an upper layer and a wiring layer 19 which is the upper layer including a conductive material such as copper. Preferably, the electroplating seed layer 16 has a thickness of 200 nm to 2000 nm. In each wiring 15, a part of the electroplating seed layer 16 is connected to the connection pad 12 via the openings 13a and 14a. The wirings 15 are wirings for making the electronic circuit 2 and other electronic circuit such as a transistor of the semiconductor substrate 11 of the semiconductor structure 1B be conductive with the external connection electrodes 21.

On the upper surface of the electroplating seed layer 16, a wiring layer 19 formed of a conductive material such as copper and a wall layer 24 are formed.

The wiring layer 19 is thicker than the electroplating seed layer 16, and preferably, the thickness is 1 μm to 5 μm, for example. With respect to each of the wirings 15, a land is formed at the end part of the wiring 15 on the opposite side of the connection pad 12 and an external connection electrode 21 formed of a conductive material such as copper is formed on the land. Each of the external connection electrodes 21 is formed in a columnar shape, for example, and the diameter of each of the external connection electrodes 21 is 50 to 500 μm. The height of each of the external connection electrodes 21 is about 45 to 99 μm and is about 50 to 100 μm when combined with the thickness of the wiring 15.

Each of the wirings 15 which is a layered structure of the electroplating seed layer 16 and the wiring layer 19 connects one or a plurality of connection pads 12 and one or a plurality of external connection electrodes 21 which correspond to the wiring 15. Further, the wirings 15 are arranged so as to be electrically insulated from other wirings 15 adjacent to each other.

The wall 23 is provided so as to encircle the openings 13h and 14b and is formed in a rectangular shape seen planarly from above. The wall 23 includes the electroplating seed layer 16 which is the lower layer including copper or the like which becomes a core for electroplating the upper layer and the wall layer 24 which is the upper layer including a conductive material such as copper or the like. The wall layer 24 includes a conductive material such as copper. The width of the wall 23 is 70 to 100 μm. The height of the wall 23 is about 50 to 100 μm. Preferably, the surfaces of the wall 23 and external connection electrodes 21 are at the same surface level with each other. That is, it is preferred that the surfaces of the wall 23 and external connection electrodes 21 are at the same height level. Because the protective insulating film 13 is intervened between the wall 23 and the semiconductor substrate 11, therefore, the wall 23 is insulated from the electronic circuit 2 and other electronic circuit such as a transistor or the like of the semiconductor substrate 11 of the semiconductor structure 1B.

Here, one of the wirings 15 (a wiring for grounding) which is connected with the connection pad 12 (a connection pad for grounding) which is grounded extends to the lower part of the wall 23 and any one of the external connection electrodes 21 is conductive with the wall 23 via this wiring 15. This external connection electrode 21 is a terminal for grounding and grounds the wall 23.

In a region (device region) on the upper surface the semiconductor substrate 11 and inside of the wall 23, a transparent resin 26 which seals the electronic circuit 2 is filled. As for the transparent resin 26, a heat-curable resin such as heat-curable polyimide, epoxy resin, phenol resin or the like can be used, for example.

In the region around the external connection electrodes 21 outside of the wall 23 (a wiring region), the region being on the surfaces of the wirings 15 and the insulating film 14, a sealing resin. 22 is filled. For example, the sealing resin 22 is a composite (composite material) of a heat-curable resin such as heat-curable polyimide, epoxy resin, phenol resin or the like and a filler such as silica or the like. However, a heat-curable resin not containing a filler may also be used. The upper surfaces of the external connection electrodes 21 are exposed from the sealing resin 22.

Figure 11:
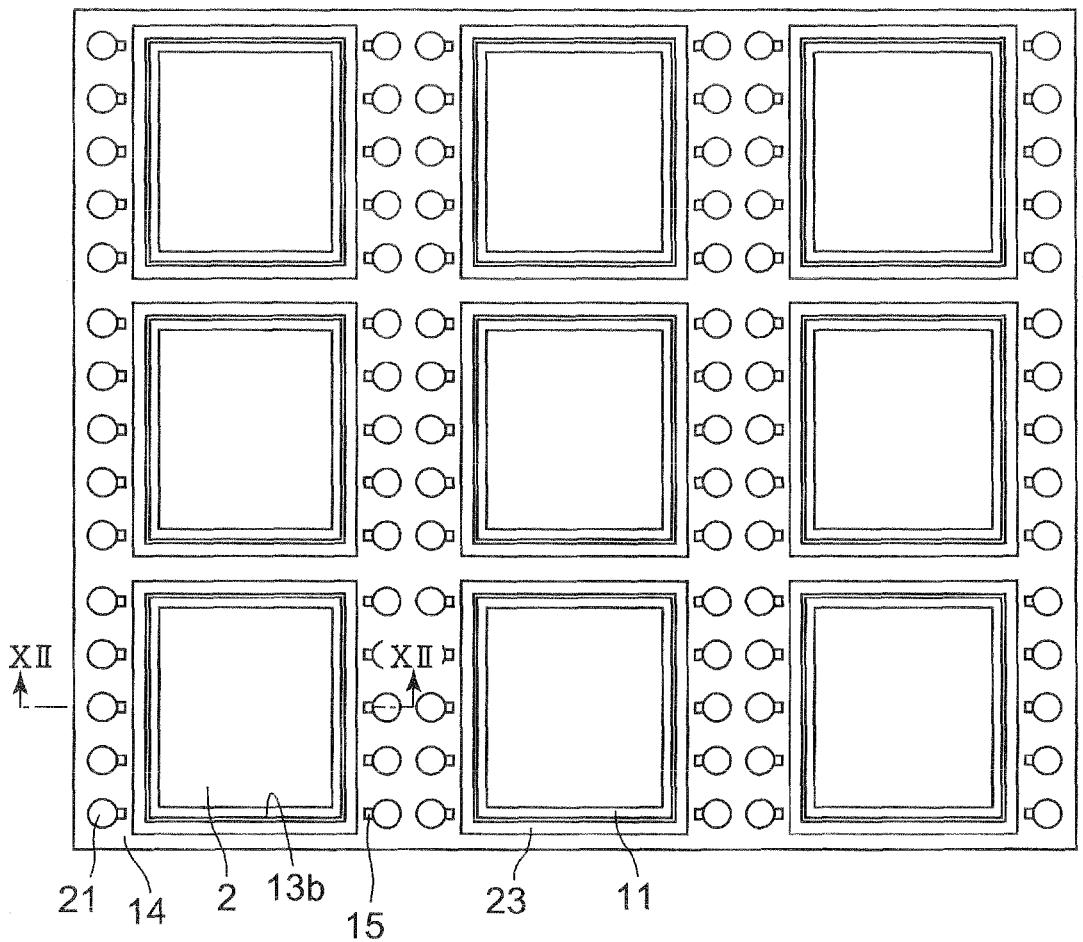
FIG. 11 is a plan view showing a semiconductor substrate in the middle of manufacturing the semiconductor structure 1B before dice cutting is carried out.
Figure 12:
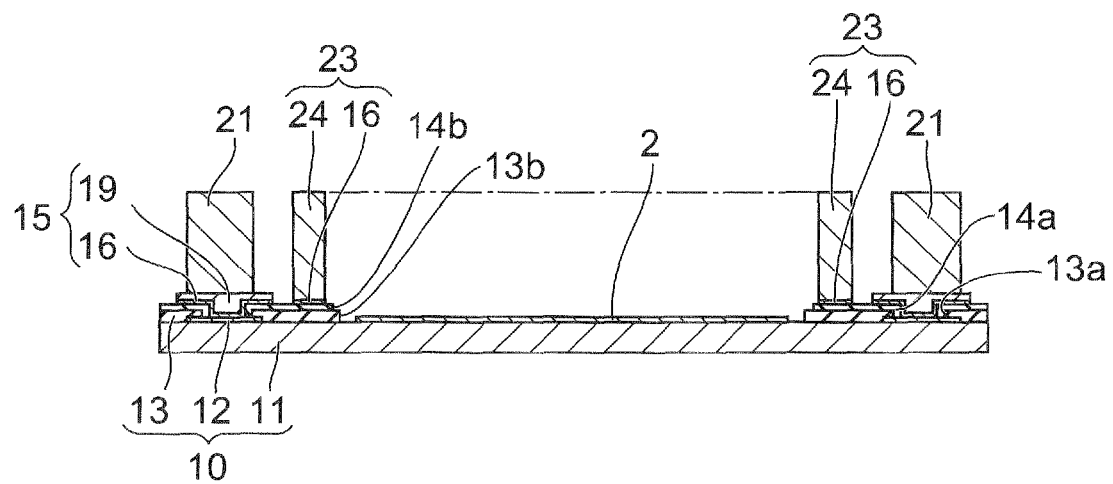
FIG. 12 cross-sectional view when cut along the line XII-XII in FIG. 11.
Figure 13:
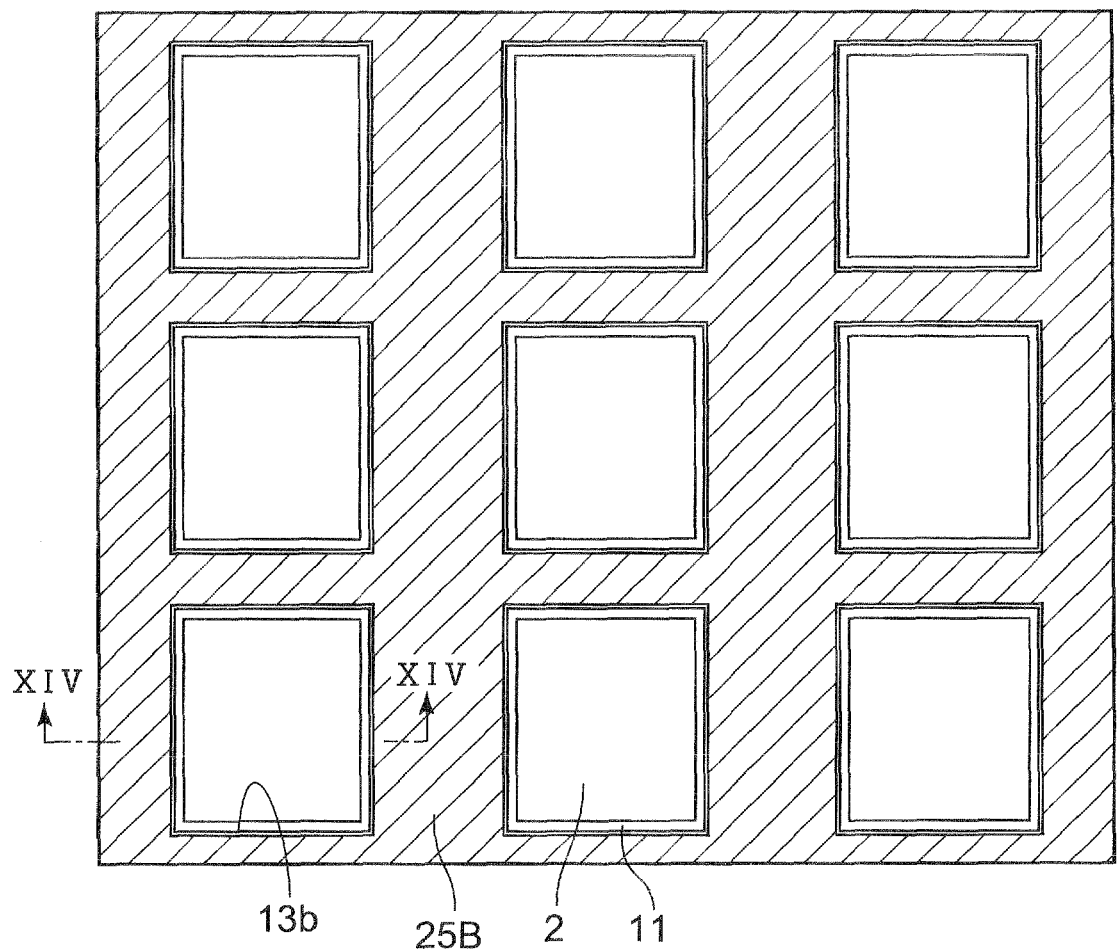
FIG. 13 is a plan view showing the semiconductor substrate in the middle of manufacturing the semiconductor structure 1B before dice cutting is carried out.
Figure 14:
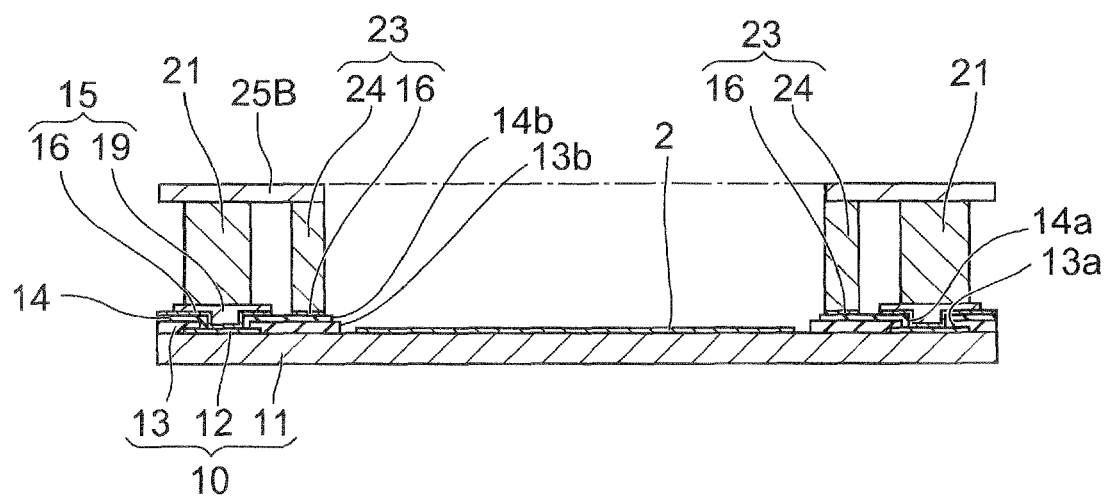
FIG. 14 is a cross-sectional view when cut along the line XIV-XIV in FIG. 13.
Figure 15:
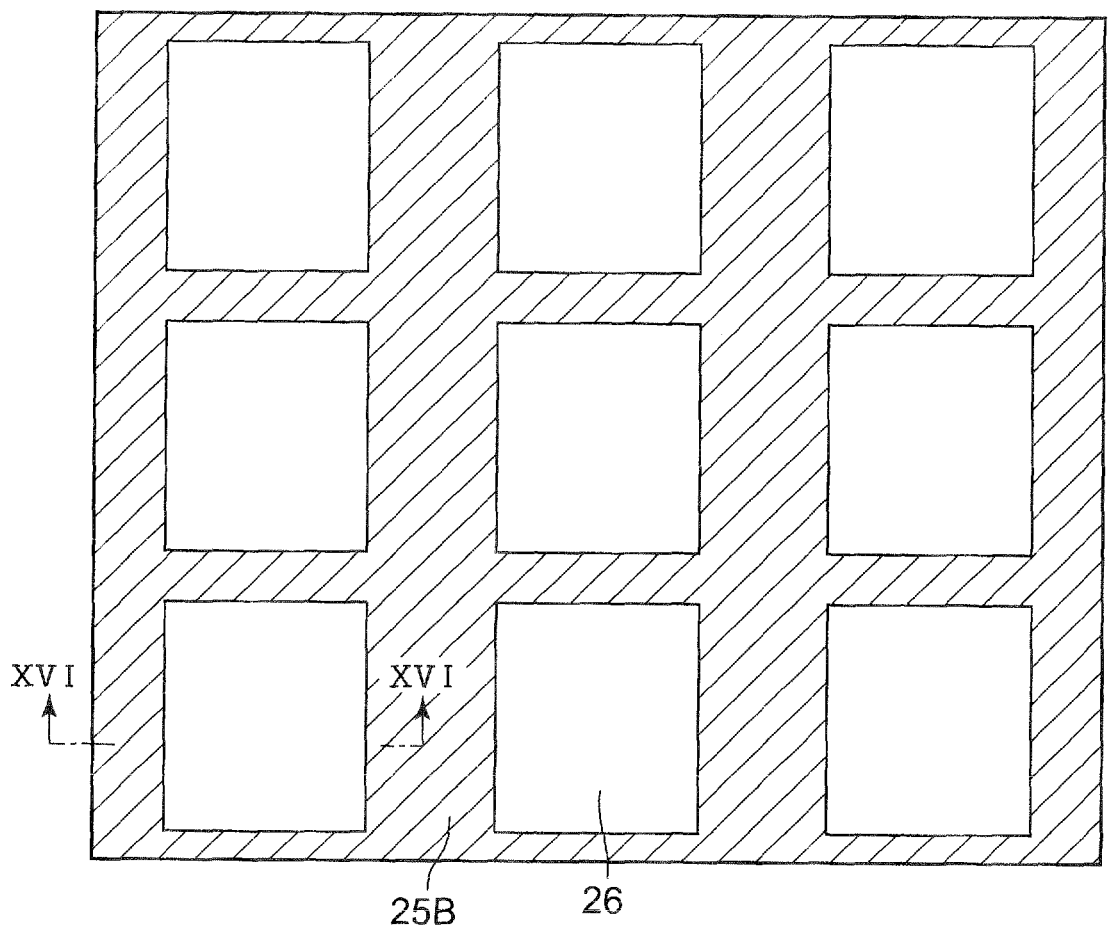
FIG. 15 is a plan view showing the semiconductor substrate in the middle of manufacturing the semiconductor structure 1B before dice cutting is carried out.
Figure 16:
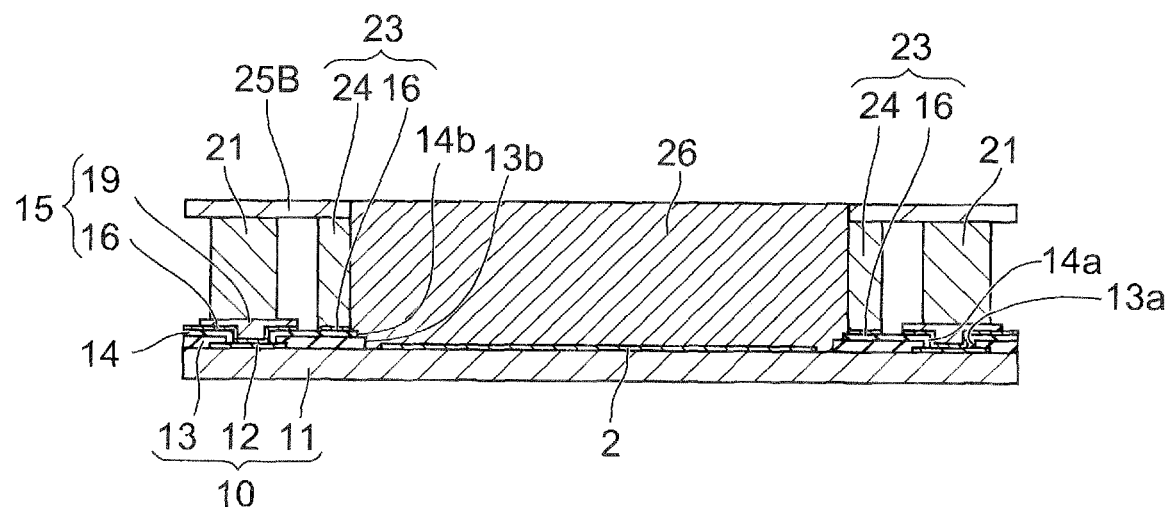
FIG. 16 is a cross-sectional view when cut along the line XVI-XVI in FIG. 15.
Figure 17:
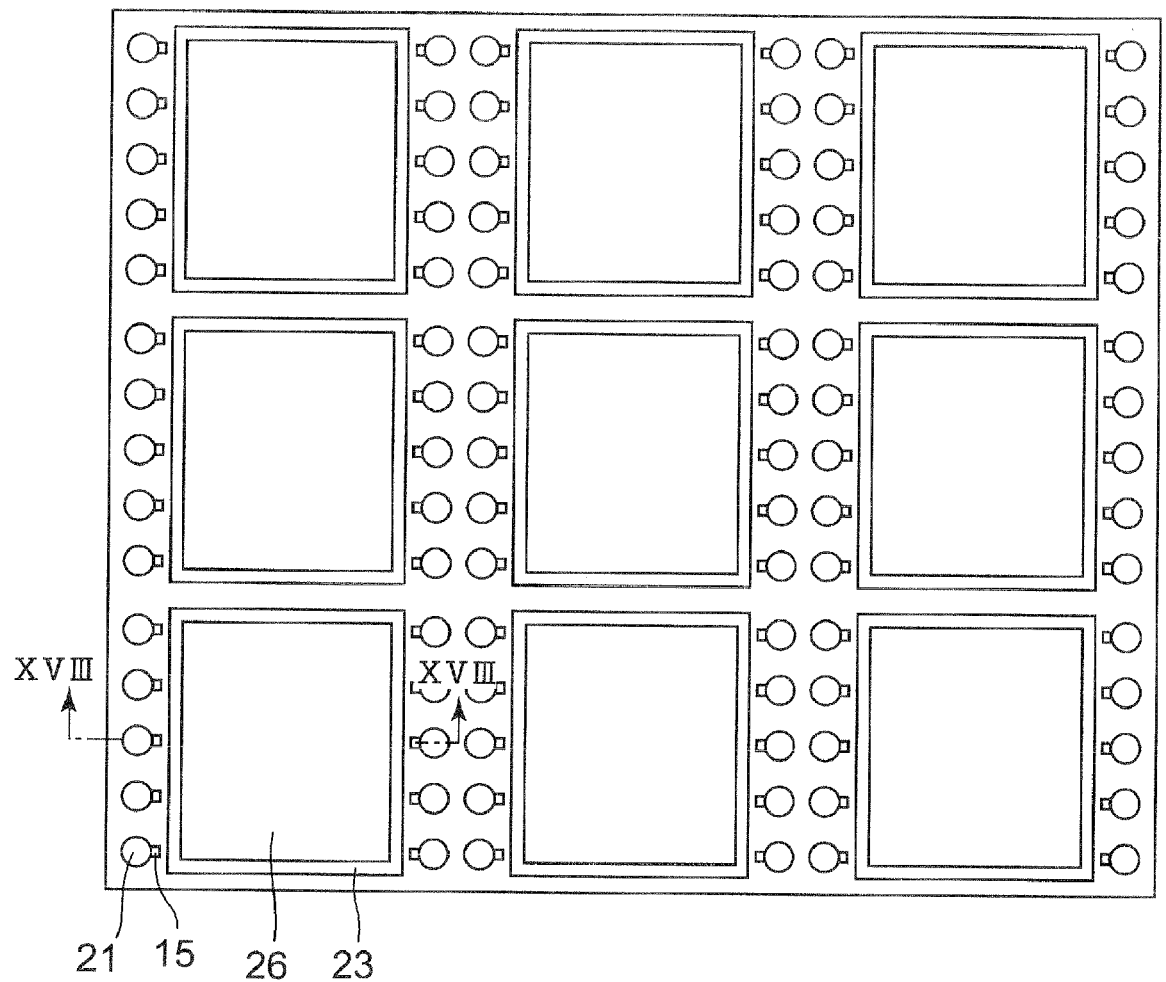
FIG. 17 is a plan view showing the semiconductor substrate in the middle of manufacturing the semiconductor structure 1B before dice cutting is carried out.
Figure 18:
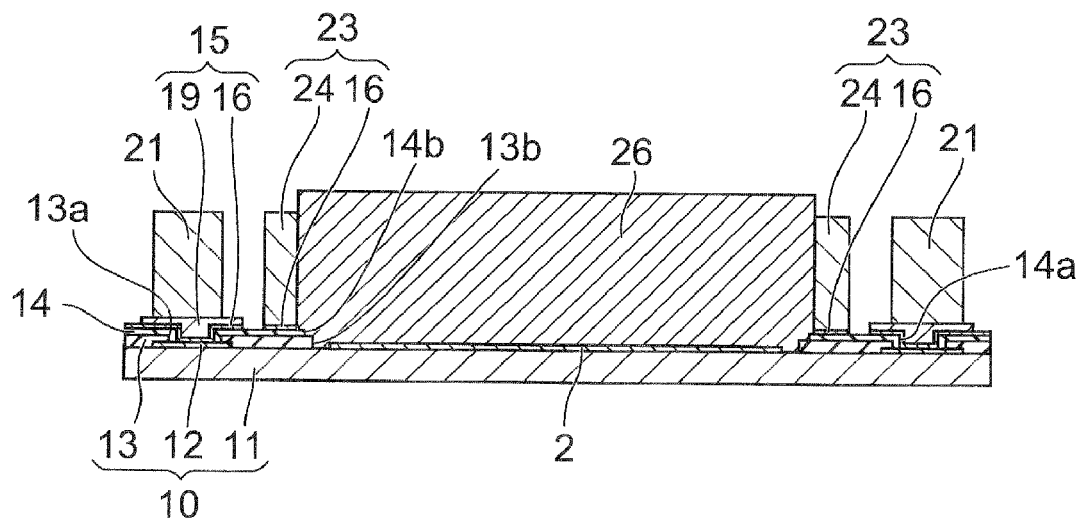
FIG. 18 is a cross-sectional view when cut along the line XVIII-XVIII in FIG. 17.

Next, a manufacturing method of the semiconductor structure 1B will be described by using FIGS. 3 to 18. Here, FIGS. 3 to 10 are cross-sectional views of the semiconductor substrate in the middle of manufacturing before dice cutting is carried out. Further, FIGS. 11, 13, 15 and 17 are plan views showing the semiconductor substrate in the middle of manufacturing the semiconductor structure 1B before dice cutting is carried out, FIG. 12 is a cross-sectional view when cut along the line XII-XII in FIG. 11, FIG. 14 is a cross-sectional view when cut along the line XIV-XIV in FIG. 13, FIG. 16 is a cross-sectional view when cut along the line XVI-XVI in FIG. 15, FIG. 18 is a cross-sectional view when cut along the line XVIII-XVIII in FIG. 17 and FIG. 20 is a cross-sectional view when cut along the line XX-XX in FIG. 19.

Figure 3:
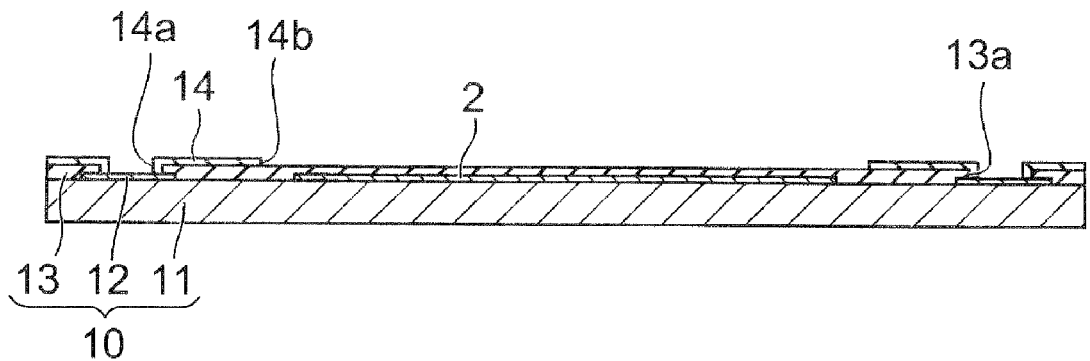
FIG. 3 is an explanatory diagram of a manufacturing method of the semiconductor structure 1B.

First, as shown in FIG. 3, on the surface of the semiconductor substrate 10 before dice cutting is carried out, in which connection pads 12 and a protective insulating film 13 are provided on a semiconductor substrate (including semiconductor wafer) 11, an insulating film 14 is formed. Here, openings 13b for exposing the electronic circuits 2 are not yet provided in the protective insulating film 13, and the electronic circuits 2 are covered with the protective insulating film 13.

Figure 4:
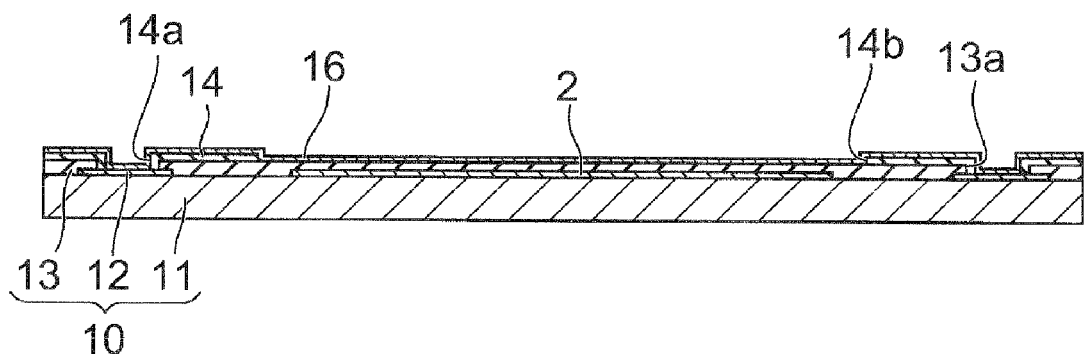
FIG. 4 is an explanatory diagram of the manufacturing method of the semiconductor structure 1B.

Next, as shown in FIG. 4, an electroplating seed layer 16 which covers the entire surface of the insulating film 14 and the connection pads 12 is formed by a vapor phase deposition method such as spattering or the like.

Figure 5:
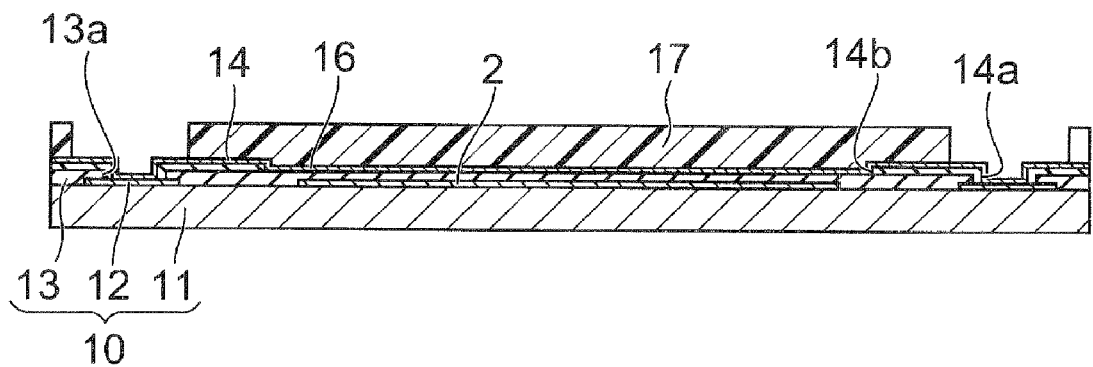
FIG. 5 is an explanatory diagram of the manufacturing method of the semiconductor structure 1B.

Thereafter, as shown in FIG. 5, a wiring resist 17 is formed on the electroplating seed layer 16 excluding the regions where the wiring layer 19 is to be formed.

Figure 6:
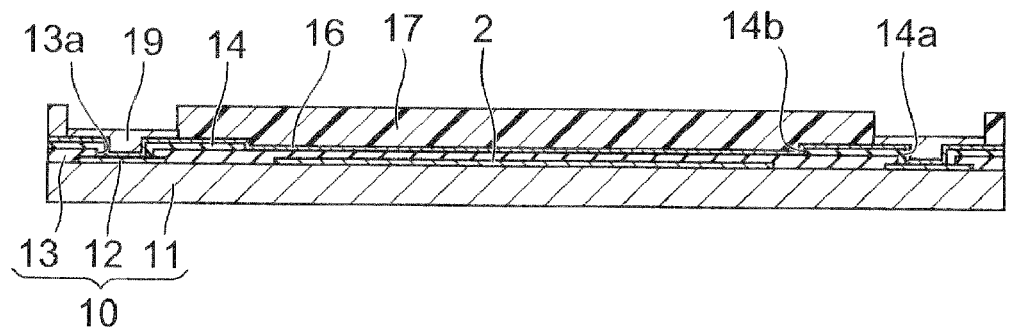
FIG. 6 is an explanatory diagram of the manufacturing method of the semiconductor structure 1B.

Next, as shown in FIG. 6, the wiring layer 19 is deposited at the regions where the wiring resist 17 is not formed by carrying out the electroplating in which the electroplating seed layer 16 is set as a negative electrode.

Figure 7:
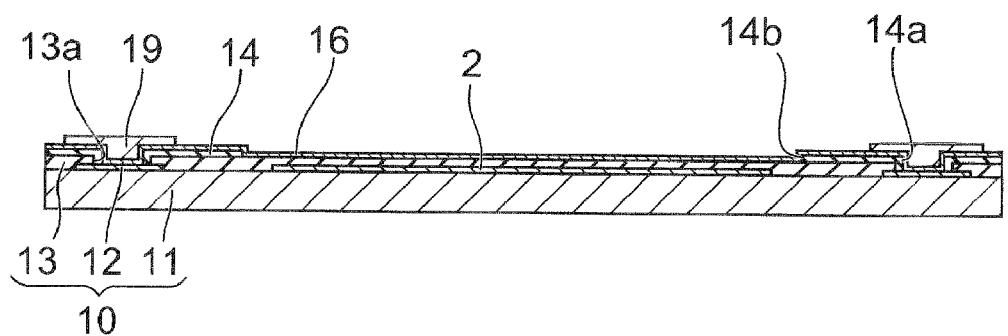
FIG. 7 is an explanatory diagram of the manufacturing method of the semiconductor structure 1B.

Thereafter, as shown in FIG. 7, the wiring resist 17 is removed.

Figure 8:
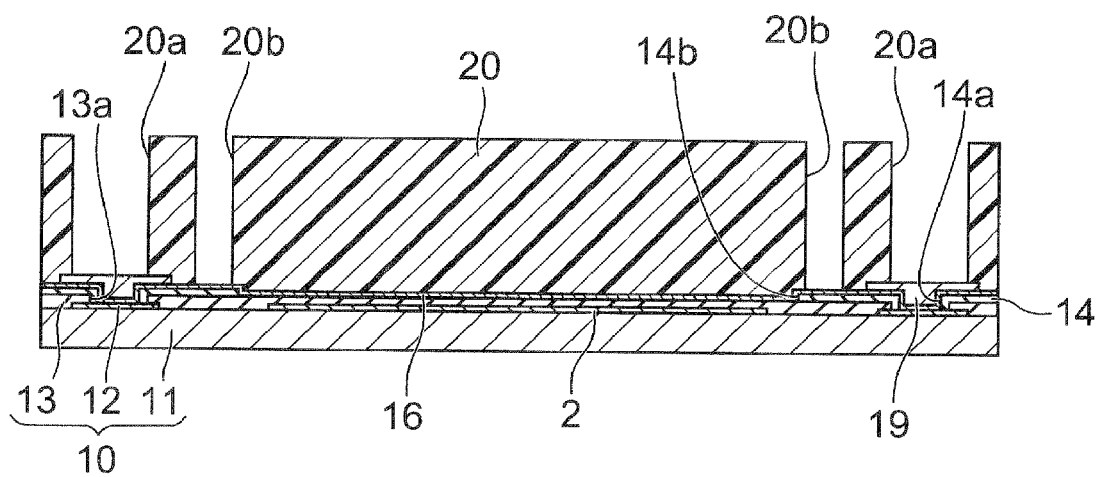
FIG. 8 is an explanatory diagram of the manufacturing method of the semiconductor structure 1B.

Next, as shown in FIG. 8, a resist 20 for the external connection electrodes 21 and the wall layer 24 is formed by attaching a dry film on the surface of the electroplating seed layer 16 and the wiring layer 19 and by patterning the dry film. Here, in the resist 20, a plurality of openings 20a are provided at the parts corresponding to where the plurality of external connection electrodes 21 are to be formed and openings lob are provided at the parts corresponding to where the wall layer 24 is to be formed.

Figure 9:
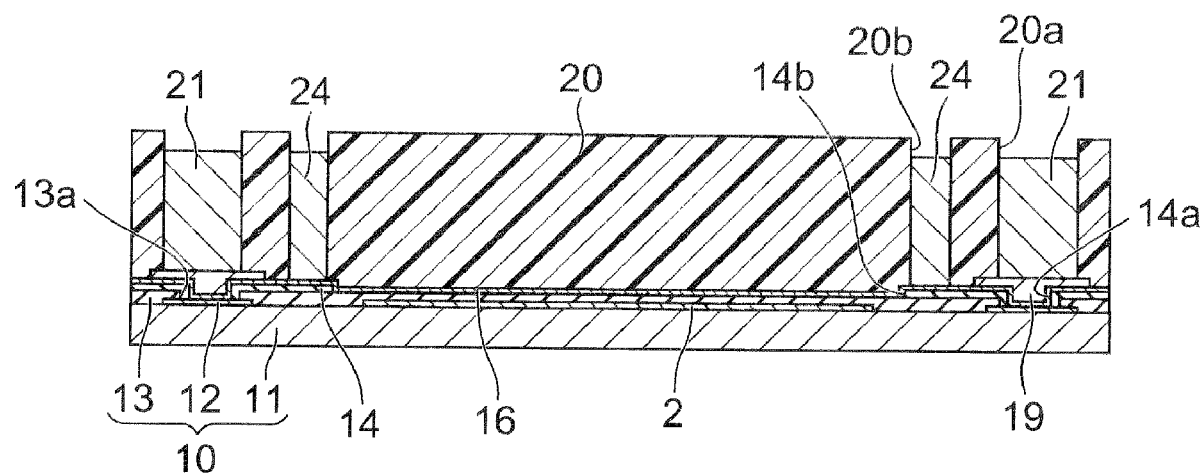
FIG. 9 is an explanatory diagram of the manufacturing method of the semiconductor structure 1B.

Thereafter, as shown in FIG. 9, by carrying out the electroplating in which the electroplating seed layer 16 is set as the negative electrode, the external connection electrodes 21 are formed by being deposited in the openings 20a of the resist 20 and the wall layer 24 is formed by being deposited in the openings 20b of the resist 20.

Figure 10:
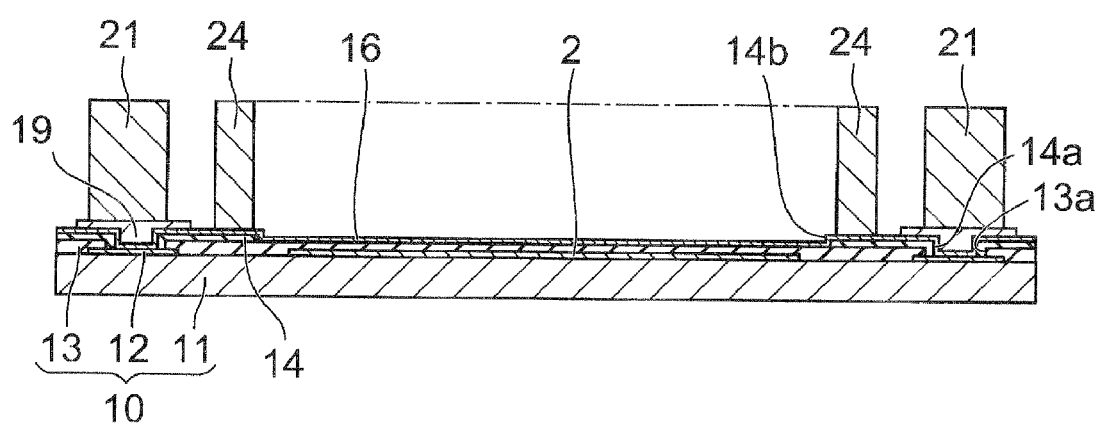
FIG. 10 is an explanatory diagram of the manufacturing method of the semiconductor structure 1B.

Next, as shown in FIG. 10, the resist 20 is removed. Subsequently, as shown in FIGS. 11 and 12, the electroplating seed layer 16 at the regions where the wiring layer 19, the external connection electrodes 21 and the wall layer 24 are not formed is removed by carrying out soft etching. In such way, the wirings 15, each of which is a layered body of the wiring layer 19 and the electroplating seed layer 16 arranged below the wiring layer 19, and the walls 23, each of which is a layered body of the wall layer 24 and the electroplating seed layer 16 arranged below the wall layer 24, are formed.

At this time, the surfaces of the wiring layer 19, external connecting electrodes 21 and wall layer 24 are also etched for about the same thickness of the electroplating seed layer 16. However, because the wiring layer 19, the external connection electrodes 21 and the wall layer 24 are considerably thicker comparing to the electroplating seed layer 16, therefore, there is no affect.

Next, a visual inspection is carried out to confirm whether there are breaks in the wirings 15 or not and whether there are foreign substances on the semiconductor device water 10 or not. Then, by carrying out the oxygen plasma treatment to the surface of the insulating film 14, foreign substances such as carbides and the like on the surface are removed.

Thereafter, as shown in FIGS. 13 and 14, a lid 25B which covers the region (region where the external connection electrodes 21 and the wirings 15 are provided) outside of the walls 23 is placed on the walls 23. As for the lid 25B, a print mask plate formed of copper, stainless or the like can be used, for example.

Next, as shown in FIGS. 15 and 16, a transparent resin 26 is filled in the region (the device region) inside of each. wall 23. At this time, because the region (the wiring region) outside of the walls 23 is covered with the lid 25B, the wiring region will not be filled with the transparent resin 26.

Next, as shown in FIGS. 17 and 18, the lid 25B is removed after the transparent resin 26 is cured.

Figure 19:
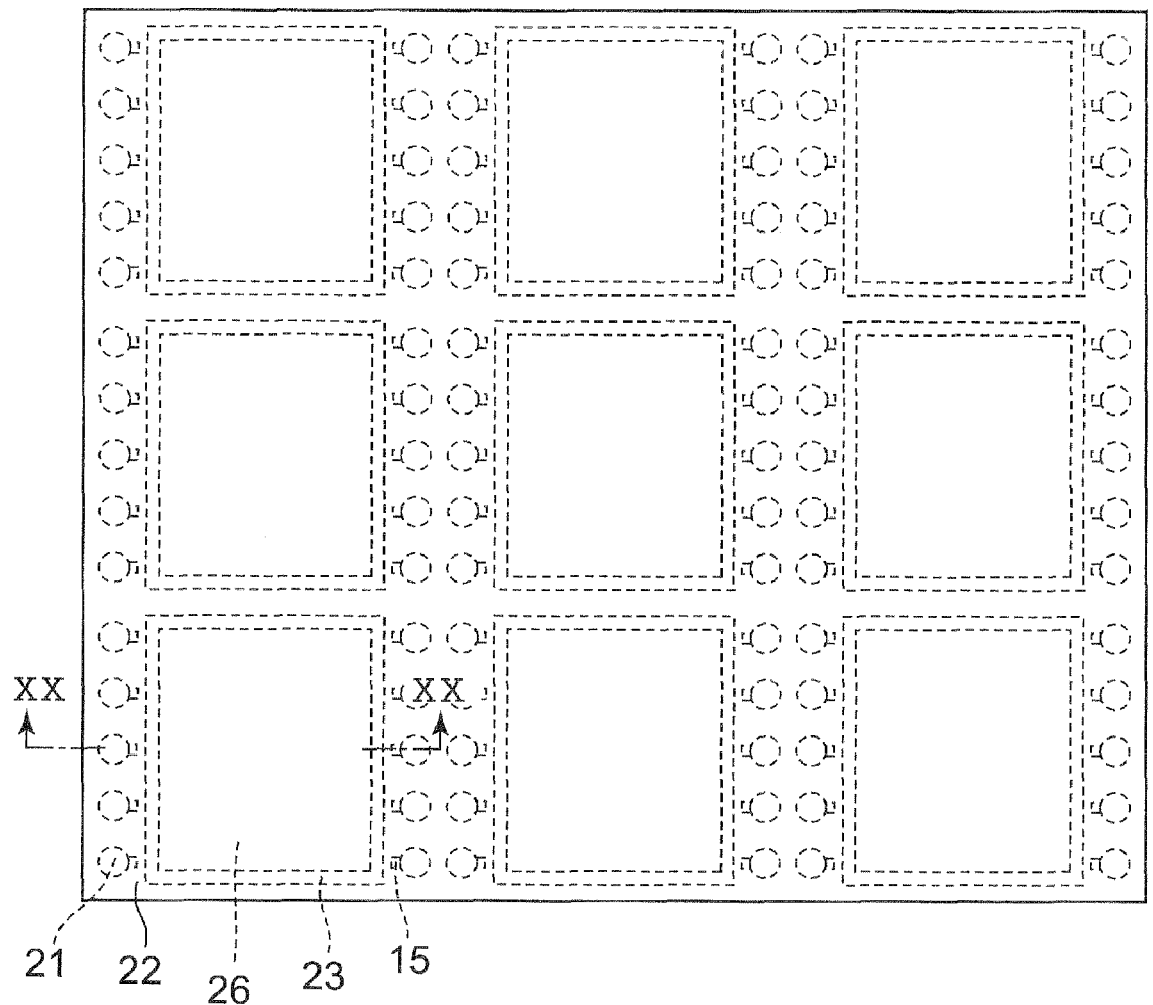
FIG. 19 is a plan view showing the semiconductor substrate in the middle of manufacturing the semiconductor structure 1B before dice cutting is carried out.
Figure 20:
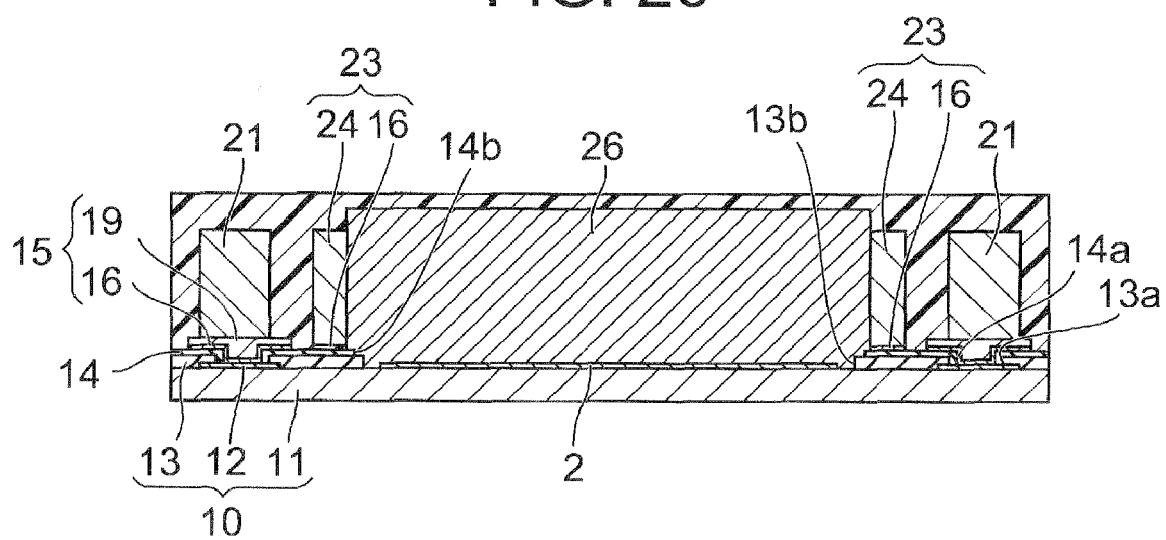
FIG. 20 is a cross-sectional view when cut along the line XX-XX in FIG. 19.

Subsequently, as shown in FIGS. 19 and 20, the sealing resin 22 is applied on the entire surface of the semiconductor substrate 11. The sealing resin 22 may have a permeability lower than the transparent resin 26.

Next, by trimming the sealing resin 22 from the upper surface, the external connection electrodes 21, the sealing resin 22, the walls 23 and the transparent resin 26 are formed so that the surfaces thereof are at the same surface level with each other. Thereafter, by carrying out dice cutting to the semiconductor substrate 11, the semiconductor structure 1B shown in FIGS. 1 and 2 is completed.

Figure 21:
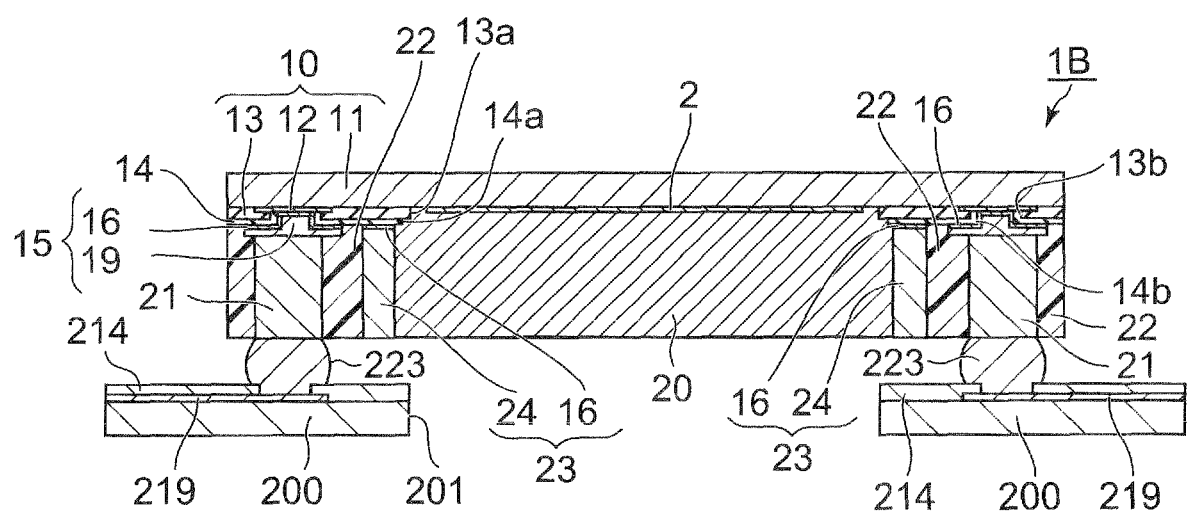
FIG. 21 is a cross-sectional view showing a configuration in which the semiconductor structure 1B is packaged.

FIG. 21 is a cross-sectional view showing a configuration in which the semiconductor structure 1B is mounted on an external circuit board. A wiring 219 is formed on the upper surface of a base substrate 200 of the external circuit board, and the wiring 219 is covered with an insulating film 214 except for the area where a solder terminal 223 is provided. The external connection electrodes 21 of the semiconductor structure 1B and the wiring 219 are connected via the solder terminal 232. The base substrate 200 has an opening 201. The wall 23 is arranged at the position corresponding to the outer peripheral section of the opening 201 and the electronic circuit 2 is arranged at the position corresponding to the opening 201.

As described above, according to the present invention, after the wall 23 which encircles the region in which the electronic circuit 2 is formed in the semiconductor device wafer 20 is formed and after the region of the semiconductor substrate outside of the walls 23 is covered with the lid 25B, the transparent resin 26 is filled in the region inside of the wall 23 to seal the region in which the electronic circuit 2 is formed. Further, because the walls 23 are formed at the same time as the external connection electrodes 21, the number of procedures can be reduced. Therefore, the productivity can be improved.

The entire disclosure of Japanese Patent Application No. 2010-075099 filed on Mar. 29, 2010 including description, claims, drawings, and abstract are incorporated herein by reference in its entirety.

Although various exemplary embodiments have been shown an described, the invention is not limited to the embodiments shown. Therefore, the scope of the invention is intended to be limited solely by the scope of the claims that follows.

What is claimed is:

1. A semiconductor structure, comprising:
   a semiconductor substrate including an electronic circuit which is provided in a predetermined region of the semiconductor substrate;
   a wall which is formed to encircle the predetermined region of the semiconductor substrate;
   a wiring provided in a region of the semiconductor substrate outside of the predetermined region of the semiconductor substrate;
   an external connection electrode provided on the wiring;
   a sealing resin which seals the wiring, the sealing resin being filled in a region of the semiconductor substrate outside of the wall; and
   a transparent resin to seal the predetermined region of the semiconductor substrate, the transparent resin being filled inside of the wall;
   wherein the wall and the external connection electrode are formed of a same material.

2. The semiconductor structure according to claim 1, wherein the wall and the external connection electrode have a same height level.

3. The semiconductor structure according to claim 1, wherein a protective insulating film intervenes between the wall and the semiconductor substrate.

4. The semiconductor structure according to claim 1, wherein the wall is grounded.

5. The semiconductor structure according to claim 4, wherein the semiconductor substrate includes a connection pad for grounding and the connection pad for grounding is connected to the wall via a wiring for grounding.

6. The semiconductor structure according to claim 1, wherein the external connection electrode is connected with an external circuit board.

7. The semiconductor structure according to claim 6, wherein a solder terminal is provided between the external connection electrode and the external circuit board.

8. The semiconductor structure according to claim 6, wherein a part of the external circuit board corresponding to the predetermined region of the semiconductor substrate forms an opening.

* * * * *